United States Patent [19]
Tsukamoto et al.

[11] Patent Number: 5,993,552
[45] Date of Patent: Nov. 30, 1999

[54] PROCESSING APPARATUS

[76] Inventors: Takeshi Tsukamoto, 97-1, Takaba, Koshimachi, Kikuchi-gun, Kumamoto-ken; Kiyohisa Tateyama, 5-1-18-401, Hotakubo, Kumamoto, Kumatomo-ken; Kazuhiko Murata, 1008-15, Kunai, Arao, Kumamoto-ken, all of Japan

[21] Appl. No.: 08/904,850

[22] Filed: Aug. 1, 1997

[30] Foreign Application Priority Data

Aug. 8, 1996 [JP] Japan .................................... 8-227512

[51] Int. Cl.$^6$ .............................. B05B 13/02; B08B 3/00
[52] U.S. Cl. ............................ 118/319; 118/61; 134/144; 134/172
[58] Field of Search ..................................... 134/902, 198, 134/199, 177, 172, 153, 158, 149, 144; 269/21; 279/3; 118/52, 319, 61, 600; 15/302, 320, 323; 34/58, 59, 236

[56] References Cited

U.S. PATENT DOCUMENTS

| | | | |
|---|---|---|---|
| 5,349,978 | 9/1994 | Sago et al. | 134/902 |
| 5,608,943 | 3/1997 | Konishi et al. | 134/153 |
| 5,718,763 | 2/1998 | Tateyama et al. | 134/902 |

*Primary Examiner*—Curtis Mayes
*Assistant Examiner*—Calvin Padgett
*Attorney, Agent, or Firm*—Oblon, Spivak, McClelland, Maier & Neustadt, P.C.

[57] ABSTRACT

A processing apparatus comprises a resist coating machine for coating resist on the surface of a substrate, a resist removing machine for removing the unnecessary resist stuck to the peripheral portion of the substrate carried out of the resist coating machine, and a transport arm for transporting the substrate from the resist coating machine to the resist removing machine, wherein the resist removing machine comprises a substrate table on which the substrate brought in by the transport arm is placed, a nozzle for spraying a solvent on the peripheral portion to remove the unnecessary resist stuck to the peripheral portion of the substrate on the substrate table; a discharge machine for discharging the solvent used to dissolve and remove the unnecessary resist and the dissolved and removed resist, and an exhaust machine for exhausting the atmosphere under the substrate table downward.

8 Claims, 9 Drawing Sheets

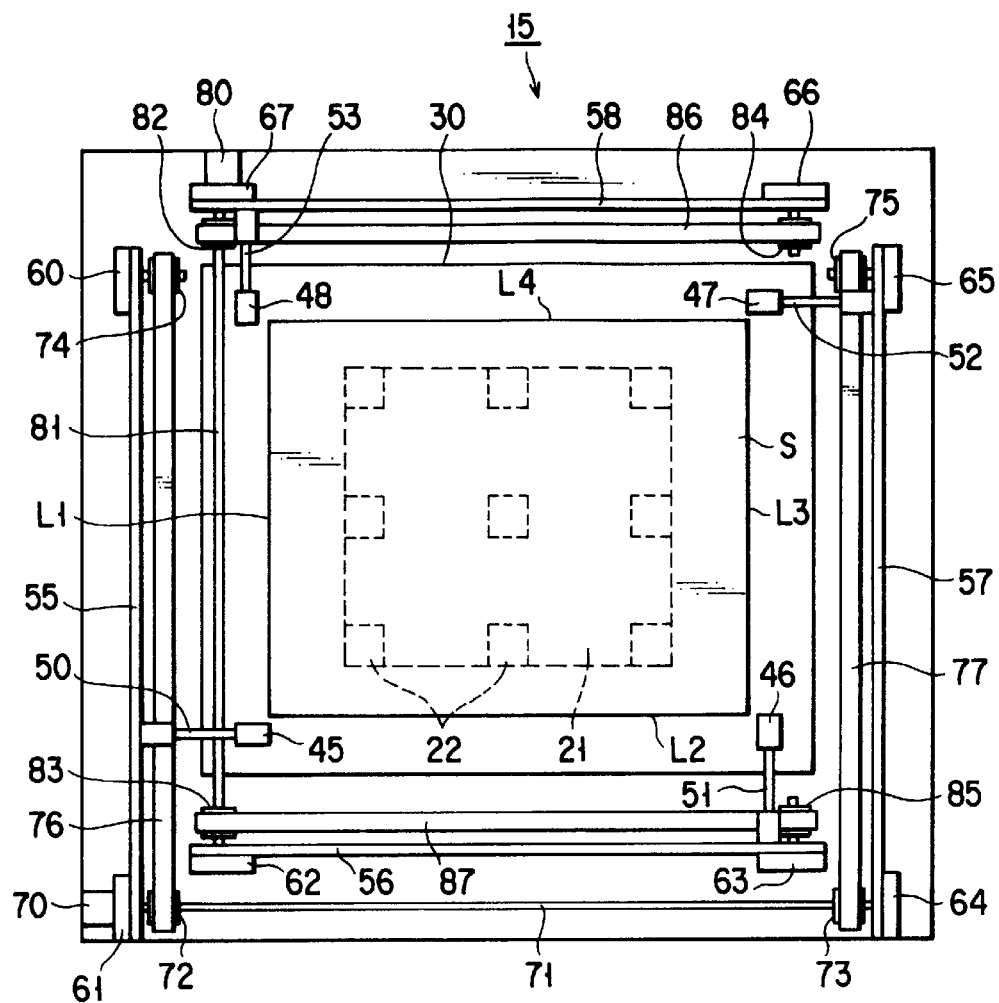
F I G. 3
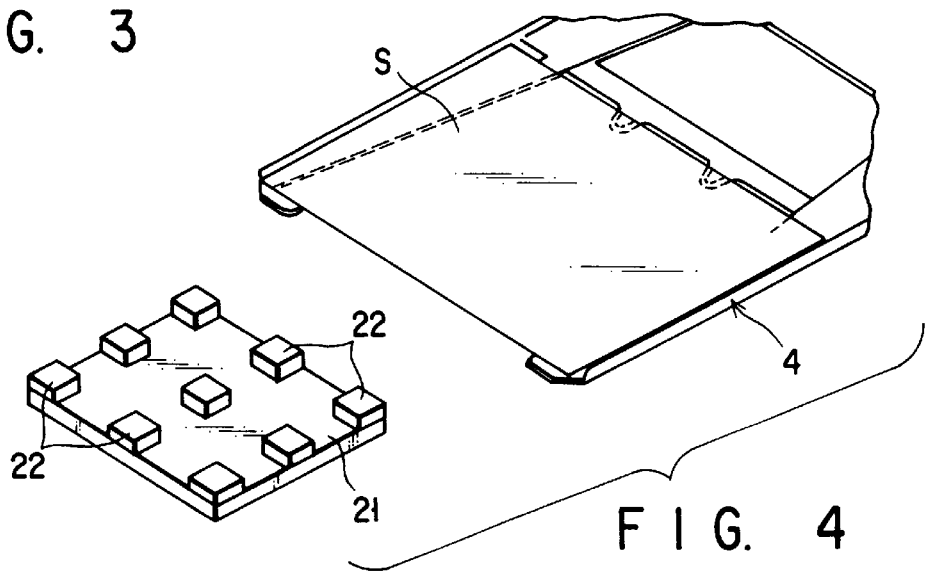
F I G. 4

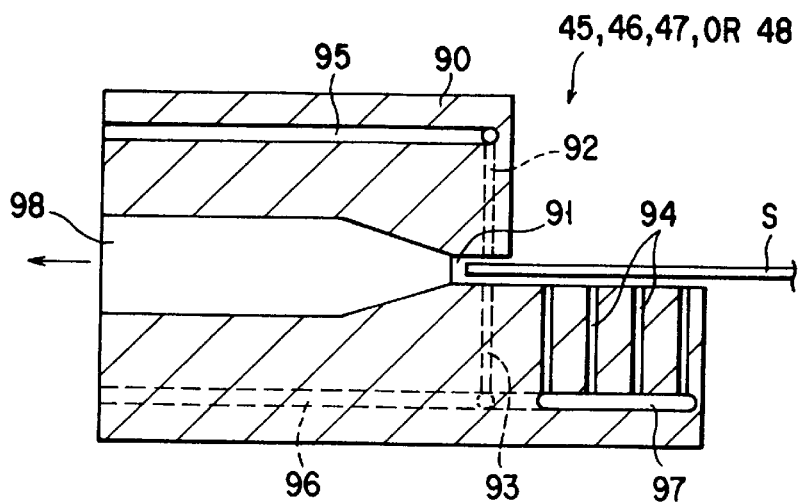
F I G. 9
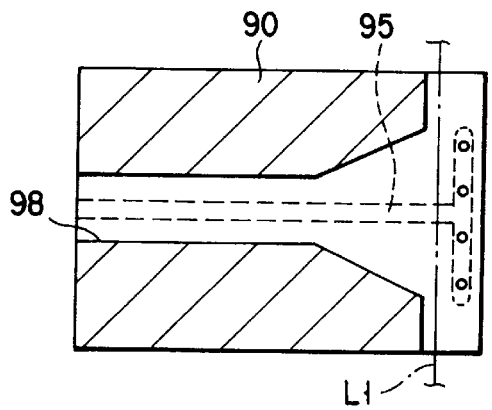
F I G. 10
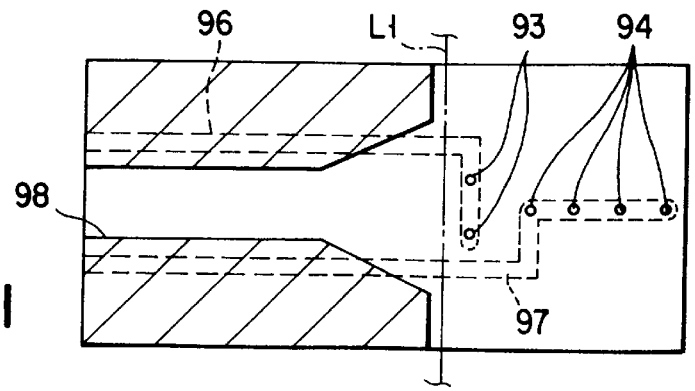
F I G. 11

PROCESSING APPARATUS

BACKGROUND OF THE INVENTION

This invention relates to a processing apparatus for removing a remaining processing agent from the edge portion of a substrate, such as an LCD substrate or a semiconductor wafer.

In the manufacture of liquid-crystal displays (LCDs) or semiconductors, lithography processing is carried out to form a resist film pattern on the top surface of an LCD substrate or a semiconductor wafer. The lithography processing includes various processing steps, including the washing of a substrate, the drying of the substrate, the application of resist to the surface of the substrate, the exposure of a photosensitive film, and development. For example, after a substrate has been washed, it is subjected to an adhesion process. After the resulting substrate has been cooled, photoresist, a type of resist, is applied to the substrate to form a photosensitive film on the surface of the substrate. After the substrate has been heated in a baking process, an exposure machine or optical stepper exposes the photosensitive film to form a specific pattern. After a developer has been applied to the exposed surface of the substrate and the pattern has been developed, the developer is rinsed in a rinse solution, which completes the developing process.

In such a lithography process, the process of applying resist uses a spin coating method or a spray method. When resist is applied by these methods, the film thickness immediately after the application is uniform. After the rotation has been stopped and centrifugal force has not been exerted, or as time passes, the effect of surface tension permits the resist to get thicker at the substrate peripheral portion. There may be a case where the resist shaken off by rotation will fly to the back of the substrate and stick to unexpected portions. Such a non-uniform film formed at the periphery of the substrate and the resist stuck to the back contribute to the generation of particles in subsequent processes, including the process of transporting the substrate. The resist stuck to the back of the substrate also contribute to soiling the substrate transporting machine.

To avoid these problems in the prior art, the process of removing the unnecessary resist stuck to the periphery and back of the substrate is carried out after resist has been applied to the surface of the substrate. The removal process is achieved by moving a nozzle along the periphery of the substrate, supplying a resist solvent from the nozzle, and simultaneously sucking the dissolved resist by the supply of the solvent, thereby removing the resist.

Since generally used solvents are highly volatile, removal of the unnecessary resist using a solvent causes the fear that the solvent will evaporate into the surrounding atmosphere and worsen the environment. There is a possibility that the solvent evaporated in the surrounding atmosphere will have an adverse effect on the substrate and related things in the remaining processes. With a processing system for subjecting a substrate to a lithography process, to prevent such a solvent vapor from leaking out into the surrounding atmosphere, a fan filter unit is provided in the upper part of the apparatus to form a down flow. Just providing such a fan filter unit cannot prevent the solvent vapor completely from leaking out.

BRIEF SUMMARY OF THE INVENTION

The object of the present invention is to provide a processing apparatus with a mechanism that prevents the vapor of a solvent used to dissolve and remove a processing agent, such as resist.

The foregoing object is accomplished by providing a processing apparatus comprising a substrate table on which a substrate whose surface has been applied with a processing agent is placed; a nozzle mechanism which moves relatively along the periphery of a substrate placed on the substrate table and supplies a solvent to the periphery to dissolve at least the processing agent stuck to the surface of the periphery of the substrate; a sucking machine for sucking and removing the processing agent dissolved by the supply of the solvent; and an exhaust machine provided below the substrate on the substrate table.

With the processing apparatus, the exhaust machine located below the substrate exhausts the solvent vapor used to dissolve and remove the processing agent downward, thereby preventing the solvent vapor from leaking out into the surrounding atmosphere. When a fan filter unit is provided above the substrate, performing the intake by the fan filter unit and the exhaust by the exhaust machine at the same time produces a down flow around the substrate, which enables the solvent vapor to be exhausted downward efficiently.

With the present invention, diffusion plates that suck the gas near the substrate table uniformly may be provided between the substrate on the substrate table and the exhaust machine. This enables a uniform exhaust under and all over the bottom surface of the substrate.

Furthermore, a spray outlet for supplying a solvent for the processing agent to the reverse side of the edge portion of the substrate may be made in the nozzle. By supplying the processing agent solvent to the reverse side of the edge portion of the substrate, the processing agent stuck to the reverse side of the substrate can also be removed.

Moreover, an applying machine that applies the processing agent to the surface of the substrate may be provided adjacent to the substrate table and a transport machine that transports the substrate between the applying machine and the substrate table.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view of the peripheral resist removing machine;

FIG. 4 is a perspective view to help explain the bringing in and carrying out of a substrate in the peripheral resist removing machine;

FIG. 9 is a vertical sectional view of the nozzle;

FIG. 10 is a traverse sectional view of the nozzle, showing the top side of the clearance;

FIG. 11 is a traverse sectional view of the nozzle, showing the bottom side of the clearance;

DETAILED DESCRIPTION OF THE INVENTION

Figure 1:
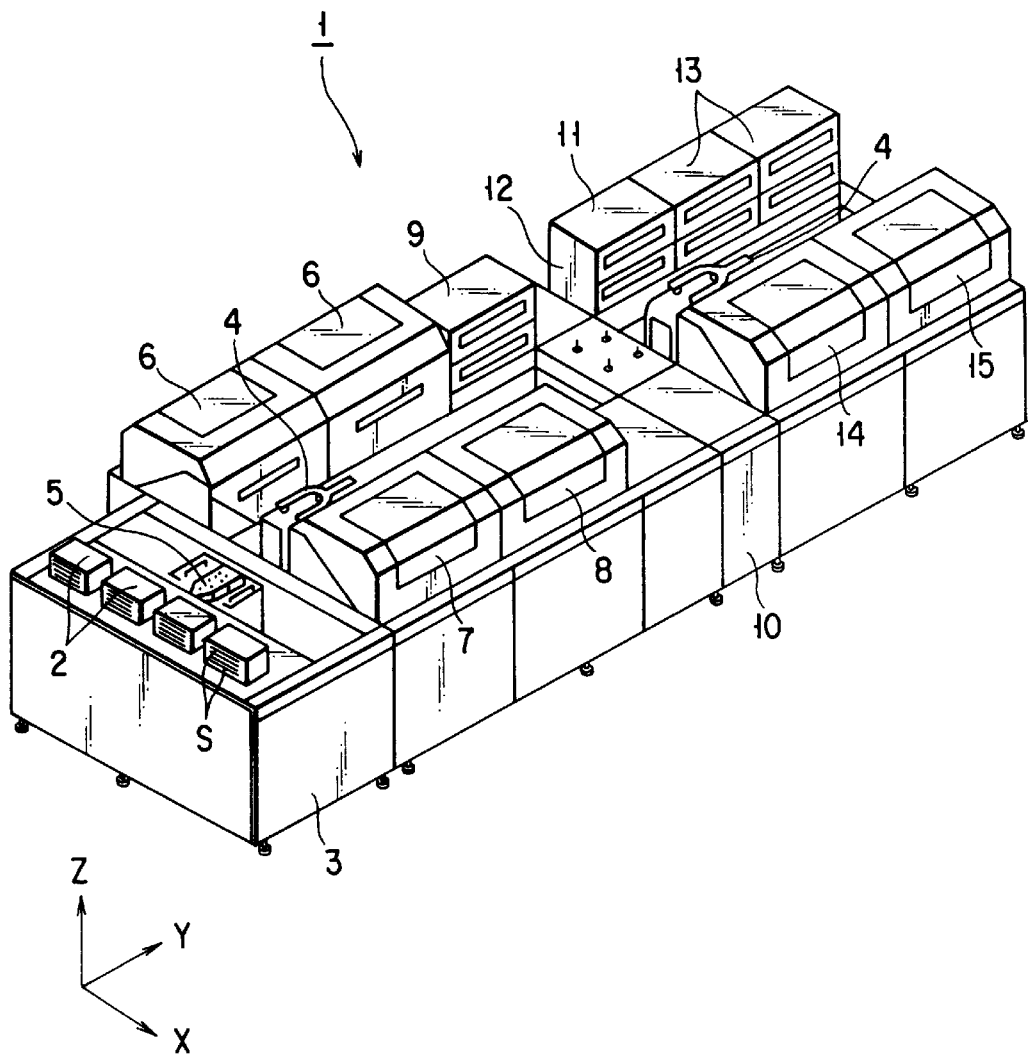
FIG. 1 is a perspective view of a resist processing system.

A resist processing system 1 shown in FIG. 1 has a cassette station 3 on its one end. On the cassette station 3, a plurality of cassettes 2 holding rectangular LCD substrates S (hereinafter, referred to as substrates S) are seated. In front of the cassettes 2 on the cassette station 2, an auxiliary arm 5 that not only transports and positions the substrate S but also holds the substrate S and hands it to a main arm 4. Two main arms 4 are arranged in series so as to be movable in the longitudinal direction in the central section of the processing system 1. On both sides of the transfer path, various processing machines that perform various processes on the substrate S are arranged.

In the processing system 1, a brush scrubber 7 for cleaning the substrate S with a brush and a high-pressure jet cleaning machine 8 for cleaning the substrate with a high-pressure jet water are provided one behind the other next to the cassette station 3. On the opposite side across the transfer path of the main arm 4, two developing machines 6 are provided side by side, next to which two heating machines 9 are laid one on top of another.

To the side of these machines, an adhesion machine 11 for subjecting the substrate S to an adhesion process before applying resist to the substrate S is provided via a connection interface unit 10. Under the adhesion machine 11, a cooling machine 12 is provided. To the side of the adhesion machine 11 and the cooling machine 12, four heating machines 13 are stacked in two rows of two. On the opposite side across the transfer path of the main arm 4, a resist applying machine 14 for applying resist to the substrate to form a resist film (photosensitive film) on the surface of the substrate S and the peripheral resist removing machine 15 for removing the resist at the periphery of the substrate. Although not shown, to the side of the resist applying machine 14 and peripheral resist removing machine 15, there is provided an optical stepper for exposing the photosensitive film formed on the substrate S to form a microscopic pattern.

The main arm 4 is provided with an x-axis drive mechanism, a y-axis drive mechanism, and a z-axis drive mechanism, which are all for making a movement in the x-axis, y-axis, and z-axis directions, respectively. The main arm is also provided with a θ-rotation drive mechanism that make a rotation centered or the z-axis. The main arm 4 travels along the central path of the resist processing system 1 to transport the substrate S between the processing machines 6, 9, 11 to 15. The main arm 4 brings the unprocessed substrate S into the processing machines 6, 9, 11 to 15 and carries out the processed substrate S from the processing machines 6, 9, 11 to 15.

Figure 2:
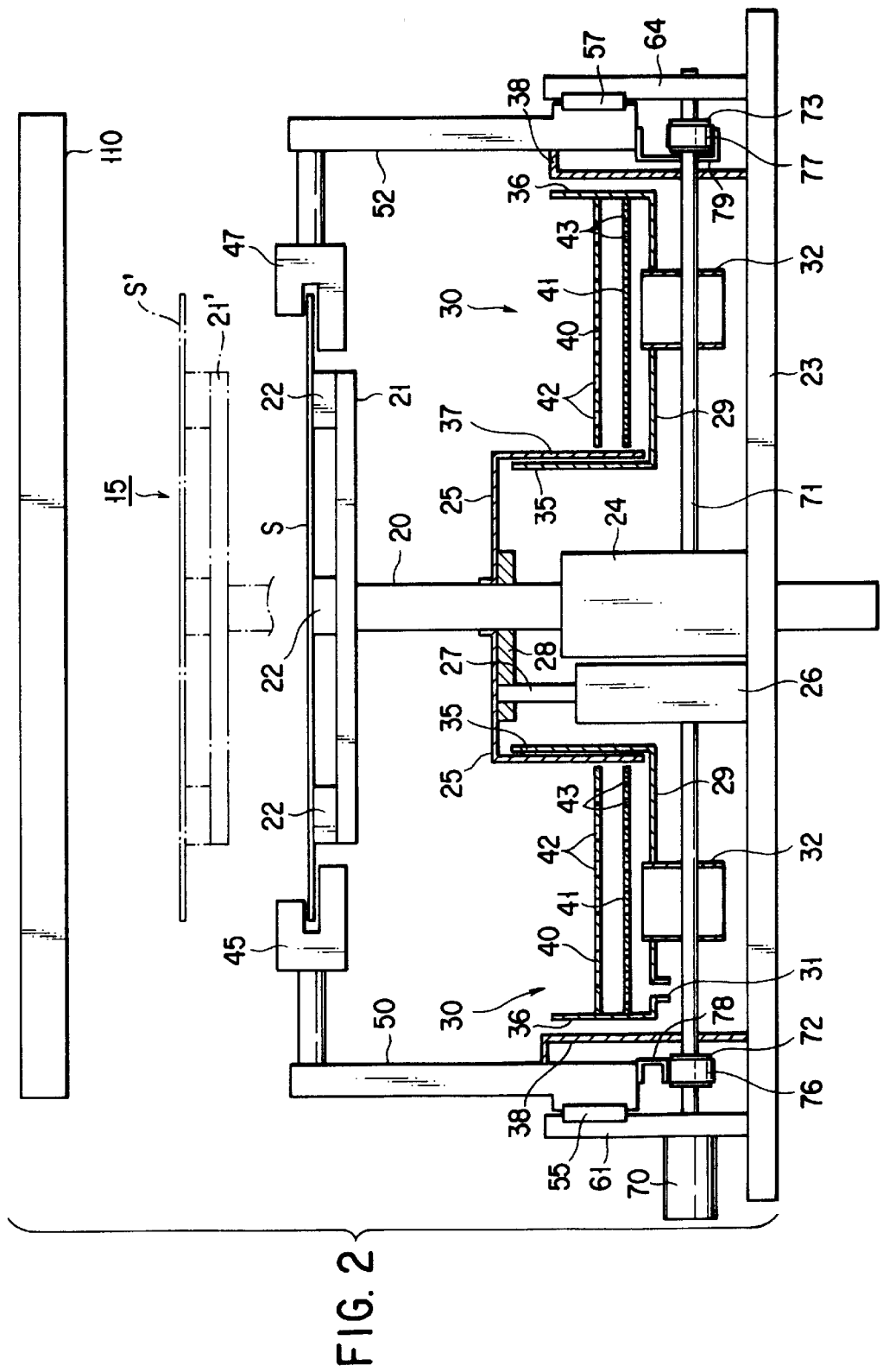
FIG. 2 is a front view of a peripheral resist removing machine.

As shown in FIGS. 2 and 3, in the center of the processing machine, i.e., peripheral resist removing machine 15, a substrate table 21 supported by the top end of a post 20 is provided. On the top surface of the substrate table 21, a plurality of suction members 22 are provided. The suction members 22 suck the bottom surface of the substrate S, thereby holding the substrate S on the top surface of the substrate table 21.

The bottom end of the post 20 penetrates through a bearing 24 fixed to a machine frame 23. The post 20 slides through the bearing 24, causing the substrate table 21 to go up and down together with the post 20. A connection member 28 connects the post 20 to the piston rod 27 of a cylinder 26 fixed to the machine frame 23. The bearing 24 and a cover 25 covering the cylinder 26 are connected to the piston rod 27. Accordingly, the up-and-down movement of the cylinder 26 causes the substrate table 21 to go up and down together with the cover 25.

When the substrate S is brought into the peripheral resist removing machine 15, the main arm 4 brings the substrate S into the peripheral resist removing machine 15. Namely, as shown in FIG. 4, the main arm 4 holds the substrate S and brings it into the peripheral resist removing machine 15.

The substrate S thus brought in is thrust upward by the top surface of the substrate table 21 that goes up as the cylinder 26 expands. At this time, the bottom surface of the substrate S is sucked by the suction members 22, thereby causing the substrate S to be seated and held on the top surface of the substrate table 21. Thereafter, the contraction of the cylinder 26 causes the substrate table 21 to go down, thereby forcing the substrate S to be brought into the peripheral resist removing machine 15.

When the substrate S is carried out of the peripheral resist removing machine 15, the substrate S in the peripheral resist removing machine 15 is thrust upward by the top surface of the substrate table 21 that goes up by the expansion of the cylinder 26. FIG. 2 shows the state where the substrate S' and substrate table 21' represented by single-dot-dash lines have been raised as a result of the expansion of the cylinder 26. After the substrate S has been raised this way, when the empty main arm 4 goes into the peripheral resist removing machine 15, the contraction of the cylinder 26 causes the substrate table 21 to go down. While the substrate table is going down, the substrate S is handed to the main arm 4. Thereafter, the main arm 4 is withdrawn from the peripheral resist removing machine 15, thereby causing the substrate S to be carried out of the peripheral resist removing machine 15.

Below the substrate S on the substrate table 21, there is provided a drain pan 30 for collecting the solvent or resist when the solvent or resist used in removing the resist at the periphery of the substrate S has dropped. The drain pan 30 is provided so as to surround the driving section of the substrate table 21, including the bearing 24 and cylinder 26. A drain pipe 31 for discharging the solvent collected in the drain pan 30 and an exhaust pipe 32 for exhausting the atmosphere within the peripheral resist removing machine 15 are connected to the bottom surface 29 of the drain pan 30. The top end of the exhaust pipe 32 has an opening at a position slightly higher than the bottom surface of the drain pan 30. Although not shown, the drain tube 31 and exhaust pipe 32 are each connected to a liquid discharge system and an exhaust system (both not shown). The liquid discharge system includes a waste fluid tank and directs the solution collected in the drain pan 30 to the waste fluid tank. The exhaust system includes a suction device, such as a pump, and exhausts the atmosphere in the peripheral resist removing machine 15 through the factory exhaust system by operating the pump.

In the example of FIG. 2, the inner circumferential wall 35 of the drain pan 30 is formed higher than the outer circumferential wall 36. The cover member 25 is provided with an annular cover wall 37 formed so as to cover the periphery of the inner wall 35. With the inner circumferential wall 35 of the drain pan 30 always being covered with the cover wall 37 of the cover member 25, the driving section of the substrate table 21, including the bearing 24 and cylinder 26, is prevented from getting dirty with solvent or resist without obstructing the free up-and-down movement of the substrate table 21.

Figure 5:
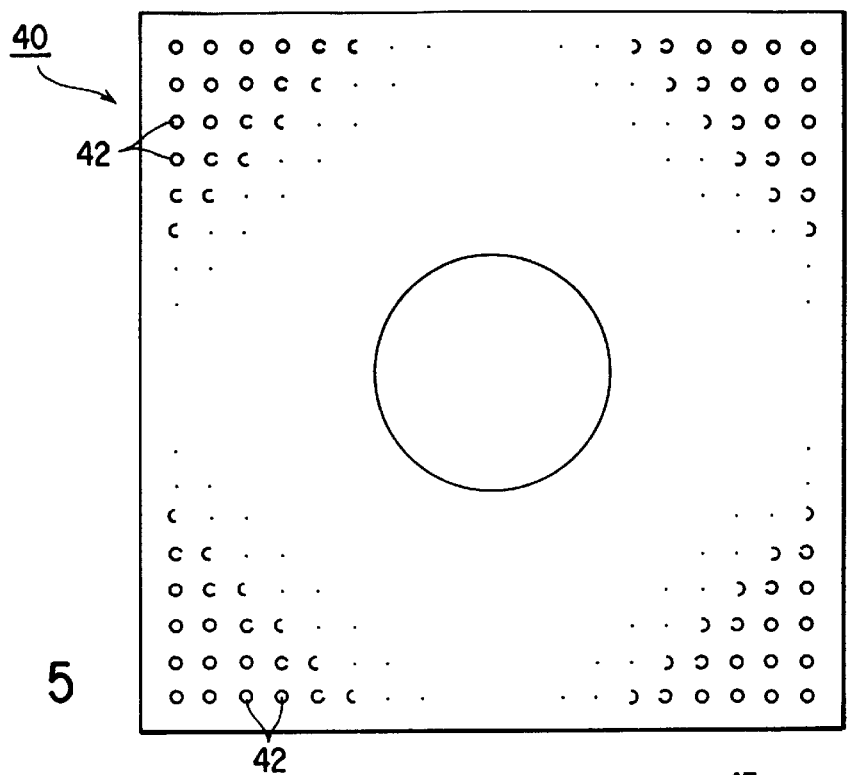
FIG. 5 is a plan view of the upper diffusion plate.
Figure 6:
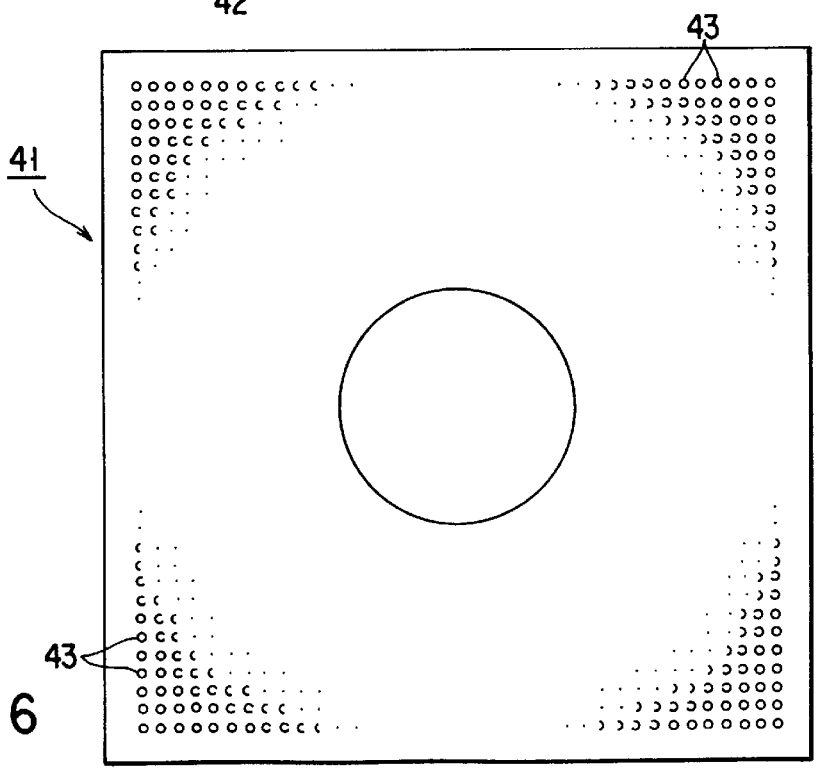
FIG. 6 is a plan view of the lower diffusion plate.

In the embodiment, two diffusion plates 40, 41 are laid one on top of another between the substrate S on the substrate table 21 and the exhaust pipe 32. These diffusion plates 40, 41 are made of punched metal plate. As shown in FIGS. 5 and 6, a large number of air vents 42, 43 are made in the diffusion plates 40, 41. In the examples in the figures, the air vents 42 in the upper diffusion plate 40 are relatively large holes, with the distance between vents 42 being relatively large. On the other hand, the air vents 43 in the lower diffusion plate 41 are relatively small holes, with the distance between vents 43 being relatively small.

The exhaust pipe 32 positions under the diffusion plate 41, so that the exhaust gas thorough the vents 42 and 43 of the diffusion plates 41 and 42 is led to the factory exhaust system via the exhaust pipe 32.

Figure 7:
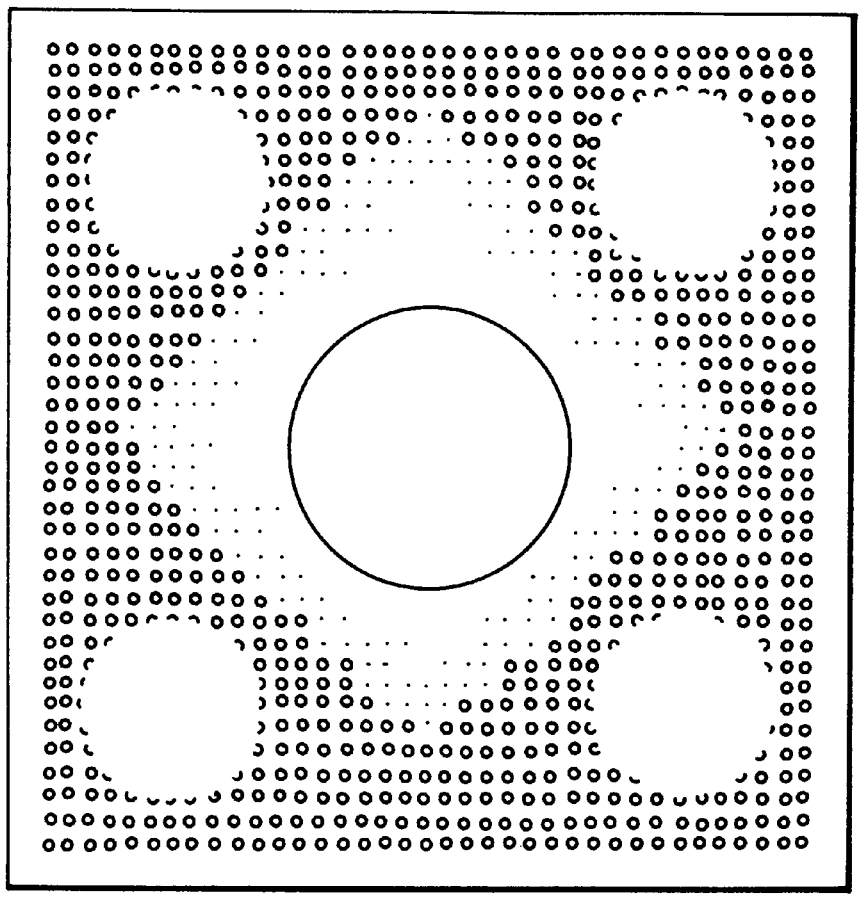
FIG. 7 is a plan view of another lower diffusion plate.

Since the vents of the diffusion plates 40 and 41 are arranged uniformly on the entire plate, the area of the diffusion plate 41 which corresponds to the exhaust pipe 32 may be largely exhausted comparing with the other area. Thus, if no vent is provided in the areas of the diffusion plate 41 which corresponds to the exhaust pipes 32 as shown in FIG. 7, the exhaust is performed uniformly over the entire plate of the diffusion plate, resulting in good exhaust efficient.

Furthermore, to prevent detergent, such as thinner, dropped to the drain pan 30 from gasifying and leaking out to the outside of the peripheral resist removing machine 15, a sidewall member 38 is provided so as to surround the drain pan 30 for preventing insertion of dust thereto.

As shown in FIG. 3, around the substrate S on the substrate table 21, there are provided nozzles 45, 46, 47, 48 that move along the corresponding four sides of the rectangular substrate S (for the sake of explanation, in FIG. 2, the nozzles 46, 43 are not shown). In the embodiment, the nozzles 45, 47 are arranged so as to face each other and move along the short sides L1, L3 of the substrate S, respectively. The nozzles 46, 48 are arranged so as to face each other and move the long sides L2, L4 of the substrate S, respectively. These nozzles 45, 46, 47, and 48 are provided at the tips of L-shaped moving members 50, 51, 52, 53, respectively. As shown in the figures, guide rails 55, 56, 57, and 58 are arranged so as to surround the substrate S. These guide rails 55, 56, 57, and 58 are supported by support members 60, 61, 62, 63, 64, 65, 66, and 67 that are fixed to the machine frame 23. The base ends of the moving members 50, 51, 52, and 53 are provided on the guide rails 55, 56, 57, and 58, respectively, so as to slide freely, which enables the nozzles 45, 46, 47, and 48 to move along the four sides L1, L2, L3, L4 of the substrate S, respectively.

Figure 8:
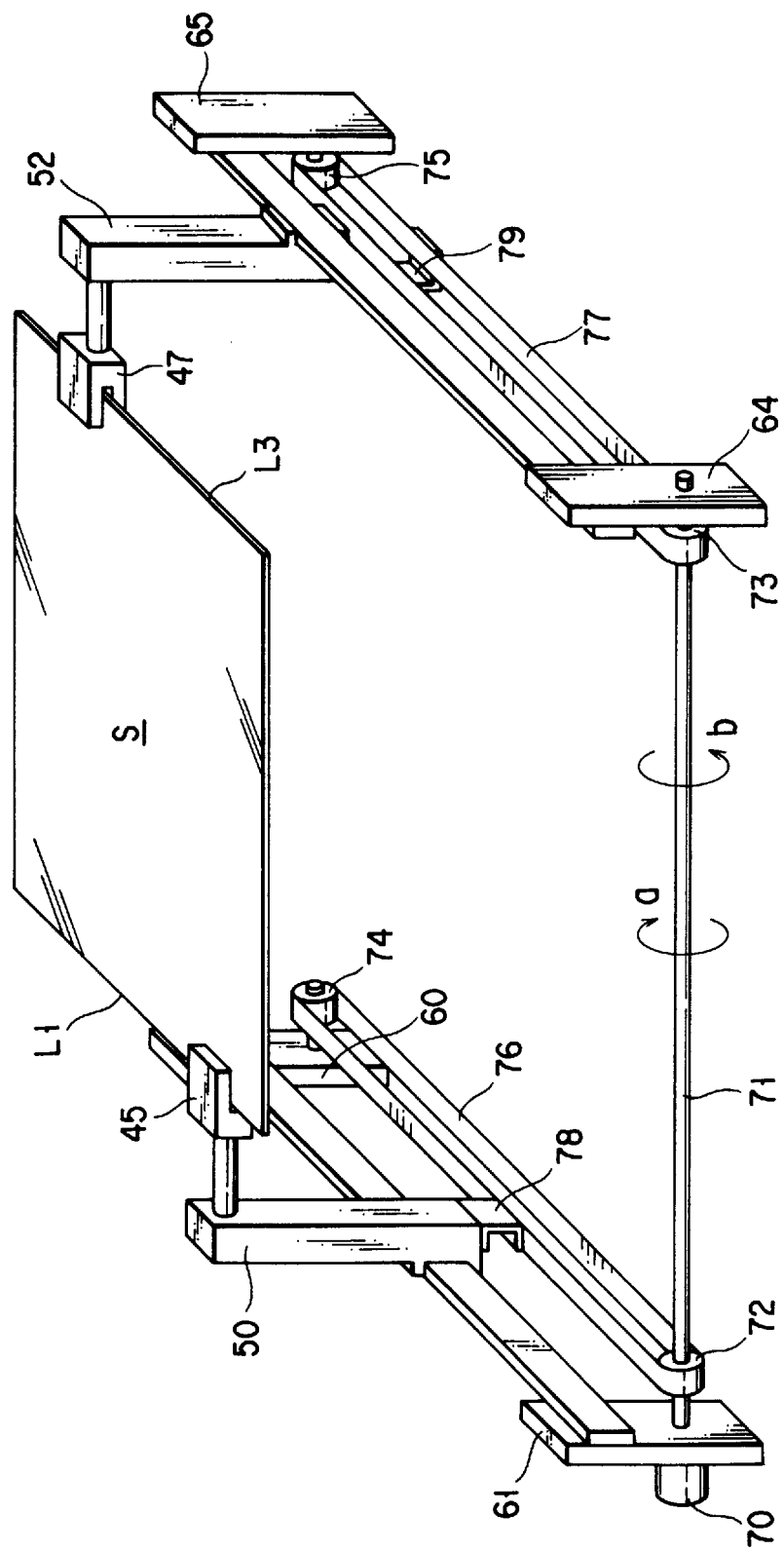
FIG. 8 is a perspective view of a moving mechanism for a nozzle.

The nozzles 45, and 47 that move along the short sides L1, L3 of the substrate S will be described by reference to FIGS. 2, 3, and 8. A motor 70 is provided on the outside of the support member 61. The motor's driving shaft 71 is extended to the support member 64 arranged so as to face the support member 61. The driving shaft 71 is provided with a driving pulley 72 near the inside of the support member 61 and with a driving pulley 73 near the inside of the support member 64. On the other hand, a driven pulley 74 is provided near the inside of the support member 60. Similarly, a driven pulley 75 is provided near the inside of the support member 65.

An endless belt 76 is wound around the driving pulley 72 and driven pulley 74. An endless belt 77 is wound around the driving pulley 73 and driven pulley 75. As a result, the operation of the motor 70 causes these two endless belts 76, and 77 to move in the same direction.

The moving member 50 supporting the nozzle 45 is connected to the upper side of the endless belt 76 via a bracket 78. The moving member 52 supporting the nozzle 47 is connected to the under side of the endless belt 77 via a bracket 79. In this way, one moving member 50 is interlocked with the upper side of the endless belt 76 and the other moving member 52 is interlocked with the under side of the endless belt 77, which enables the operation of the motor 70 to cause the nozzles 45 and 47 to move in opposite directions in parallel with each other. Specifically, in FIG. 7, when the operation of the motor 70 causes the driving shaft 71 to rotate in, for example, the clockwise direction a, the nozzle 45 moves backward along the short side L1 at left of the substrate S, whereas the nozzle 47 moves forward along the short side L3 at right of the substrate S. Furthermore, in FIG. 7, when the operation of the motor 70 causes the driving shaft 71 to rotate in, for example, the counterclockwise direction b, the nozzle 45 moves forward along the short side L1 at left of the substrate S, whereas the nozzle 47 moves backward along the short side L3 at right of the substrate S.

The nozzles 45 and 47 that move along the short sides L1 and L3 of the substrate S have been explained. The nozzles 46 and 48 have the same configuration as that of the nozzles 45 and 47 and are designed to move along the long sides L2 and L4 of the substrate S. Specifically, as shown in FIG. 3, a motor 80 is provided on the outside of the support member 67. The motor's driving shaft 81 is extended to the support member arranged so as to face the support member 62. The driving shaft 81 is provided with a driving pulley 82 near the inside of the support member 67 and with a driving pulley 83 near the inside of the support member 62. On the other hand, a driven pulley 84 is provided near the inside of the support member 66. Similarly, a driven pulley 85 is provided near the inside of the support member 63.

An endless belt 86 is wound around the driving pulley 82 and driven pulley 84. An endless belt 87 is wound around the driving pulley 83 and driven pulley 85. In the same manner as the nozzles 45 and 47 explained earlier, the operation of the motor 80 causes these two nozzles 46 and 48 to move along the long sides L2 and L4 of the substrate S in opposite directions in parallel with each other.

When the substrate S is brought into the removing machine by the going up and down of the substrate table 21 or when the substrate S is carried out of the removing machine 15, there is no fear that the existence of the nozzles 45, 46, 47, and 18 will prevent the substrate S from being brought in or carried out, because the nozzles 45, 46, 47, and 48 stand by in a place apart from the periphery of the substrate S as shown in FIG. 3.

Each of the nozzles 45, 46, 47, and 48 has the same configuration, so the configuration of the nozzle 45 moving along the short side L1 of the substrate S will be explained as the representative of the rest. As shown in FIG. 9, the nozzle 45 includes a nozzle body 90 with a near-L-shaped section covering the top and bottom surfaces of the periphery of the substrate. The nozzle body 90 has a clearance 91 formed so as to cover the vicinity of the periphery of the substrate S. The periphery of the substrate S sucked and held on the top surface of the substrate table 21 is inserted into the clearance 91 with the substrate out of contact with the surroundings. There are provided upper spray outlets 92 for spraying a resist solvent onto the top surface of the periphery of the substrate S inserted in the clearance 91 and lower spray outlets 93 and 94 for spraying a resist solvent onto the bottom surface of the periphery of the substrate S.

Specifically, at the upper side of the clearance 91, upper spray outlets 92 are made in a total of four places as shown in FIG. 10. These upper spray outlets 92 are arranged in parallel with the short side L1 along the vicinity of the periphery of the substrate S. A solvent is supplied to the upper spray outlets 92 through a solution supply outlet 95 in the upper part of the inside of the nozzle body 90. The thus supplied solvent spouts from the upper spray outlet 92 downward and is sprayed on the top surface of the periphery of the substrate S.

As shown in FIG. 11, at the lower side of the clearance 91, two lower spray outlets 93 and four lower spray outlets 94 are made. The lower spray outlets 93 are arranged in parallel with the short side L1 along the periphery of the substrate S. The lower spray outlets 94 arranged at right angles with the short side L1 so as to go from the vicinity of the periphery of the substrate S into the inside of the substrate S. A solvent is supplied to these lower spray outlets 93 and lower spray outlets 94 via solution supply outlets 96, 97 in the lower part of the nozzle body 90. The thus supplied solvent spouts from the lower spray outlets 93 and 94 upward and is sprayed on the bottom surface of the periphery of the substrate S.

As shown in FIG. 9, almost in the center of the nozzle body 90, there is provided a suction inlet 98 for sucking and discharging the atmosphere in the vicinity of the substrate S inside the clearance 91 to the outside.

The configuration of the nozzle 45 moving along the short side L1 of the substrate S has been explained. The other nozzles 46, 47 and 48 have the same configuration of the nozzle 45, so a detail explanation of the nozzles 46, 47 and 48 will not be given.

The processing steps of the resist processing system 1 will be explained step by step. First, the auxiliary arm 5 takes the substrate S out of a cassette 2 on the cassette station 3 as shown in FIG. 1 and hands it to the main frame 4. The main arm 4 brings the substrate S to the brush scrubber 7. The brush scrubber 7 cleans the substrate S with a brush. The substrate S may be washed with high-pressure jet water in the high-pressure jet cleaning machine 8, depending on the process. The main arm 4 conveys the thus washed substrate S, which is then subjected to a heating process at the heating machine 9. After the heating process of the substrate S at the heating machine 9 has finished, it then undergoes an adhesion process at the adhesion machine 11. Then, after the substrate S has been cooled at the cooling machine 12, resist is applied to the surface of the substrate S at the coating machine 14 by a spin coating method or a spray method. At this time, the effect of surface tension may permit the resist to get thicker in the substrate peripheral portion. There may be a case where the resist shaken off by rotation will fly to the back of the substrate and stick to unexpected portions.

The substrate S applied with resist at the coating machine 14 is conveyed by the main arm 4 and is brought into the peripheral resist removing machine 15. During the bringing in of the substrate, all of the nozzles 45, 46, 47, and 48 have been withdrawn in a position apart from the surroundings of the substrate S.

As explained earlier in FIG. 4, the substrate S brought into the peripheral resist removing machine 15 by the main arm 4 is first thrust upward by the top surface of the substrate table 21 that goes up as the cylinder 26 expands. Then, the bottom surface of the substrate S is sucked by the suction members 22, thereby causing the substrate S to be seated and held on the top surface of the substrate table 21. Then, after the empty main arm 4 has been withdrawn from the peripheral resist removing machine 15, the contraction of the cylinder 26 causes the substrate table 21 to go down, thereby forcing the substrate S to be brought into the peripheral resist removing machine 15.

After the substrate S has been brought into the peripheral resist removing machine 15, the operation of the motors 70 and 80 causes the nozzles 45, 46, 47, and 48 to start to move along the four sides L1, L2, L3, and L4 of the substrate S. As a result of the movement, the periphery of the substrate S is inserted into the clearance 91 of the nozzles 45, 46, 47, and 48 with the substrate out of contact with the surroundings. With the periphery of the substrate S inserted in the clearance 91 of the nozzles 45, 46, 47, and 48 this way, the upper spray outlets 9 and lower spray outlets 93 and 94 start to spout the solvent and the suction inlet 98 starts to suck and discharge the gas. Then, the solvent dissolves the unnecessary resist stuck to the periphery of the substrate S. The dissolved resist is sucked and discharged from the suction inlet 98, thereby removing the unnecessary resist on the periphery of the substrate S.

While the resist on the periphery of the substrate S is being removed by the solvent, the air is exhausted from under the substrate S through the exhaust pipe 32 and the atmosphere in the peripheral resist removing machine 15 is discharged downward. This prevents the vapor of the solvent used in dissolving and removing the resist from leaking out into the surrounding atmosphere. Because the diffusion plates 40 and 41 are provided between the substrate S and the exhaust pipe 32, the air can be exhausted uniformly under the entire bottom side of the substrate S. To achieve such a uniform exhaust, only a single diffusion plate may be provided. To produce a higher diffusion effect, it is desirable that two diffusion plates 40 and 41 should be provided as shown in the figure.

After the unnecessary resist stuck to the periphery of the substrate S has been removed, the substrate table 21 is raised and the main arm 4 receives the substrate S. This causes the substrate S to be carried out of the peripheral resist removing machine 15. During the carrying out of the substrate, all of the nozzles 45, 46, 47, and 48 have been withdrawn in a place apart from the surroundings of the substrate S.

Then, after the substrate S has been heated at the heading machine 13, the resist film undergoes an exposure process at the exposure machine (not shown). The exposed substrate S is brought into the developing machine 6, which subjects the substrate to a developing process. After the developing process has finished, the substrate S is carried out of the developing machine 6 by the main arm 4. The substrate S is heated again at the heating unit 9 for drying. The substrate is then housed in the cassette 2 of the cassette station 3.

In the above embodiment, the nozzles 45, 46, 47, and 48 are moved along the four sides L1, L2, L3, and L4, respectively, to remove the undesired resist remaining on the sides of the substrate S therefrom. In contrast, according to the embodiment shown in FIGS. 12 to 14, the linear nozzles 145 and 146 each have a width corresponding to that of the substrate S to be cleaned and are constructed so as move relatively with respect to the substrate S. For example, the nozzles 145 and 146 are moved toward the substrate S and clamp it. In this state, the nozzles 145 and 146 spout solvent to the substrate S, thereby cleaning opposite sides of the substrate in a lump. After the opposite sides of the substrate are cleaned as described above, the linear nozzles 145 and 146 are detached from the substrate S and then the substrate S is rotated at 90 degree to make the nozzles 145 and 146 oppose to the remaining opposite sides of the substrate S, respectively. Again, the nozzles 145 and 146 are moved to the substrate to clean the remaining sides thereof.

Figure 12:
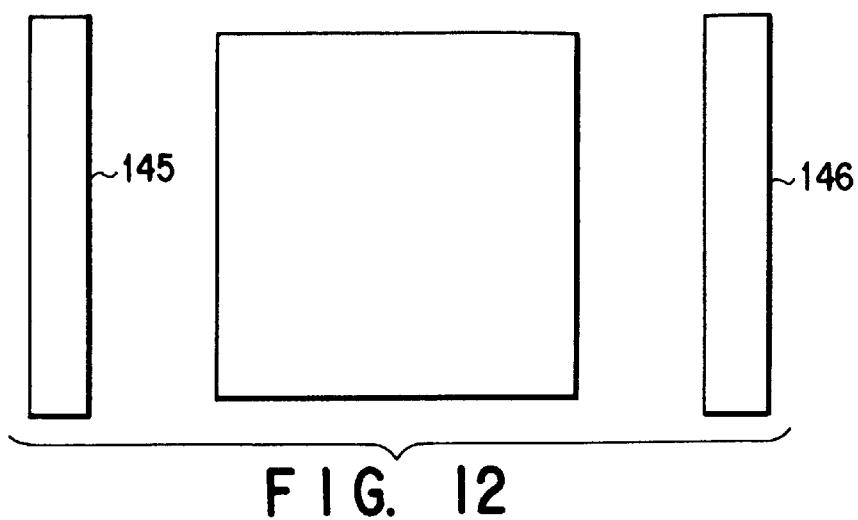
FIG. 12 is a schematic plan view of an arrangement of a substrate and a nozzle assembly according to another embodiment.
Figure 13:
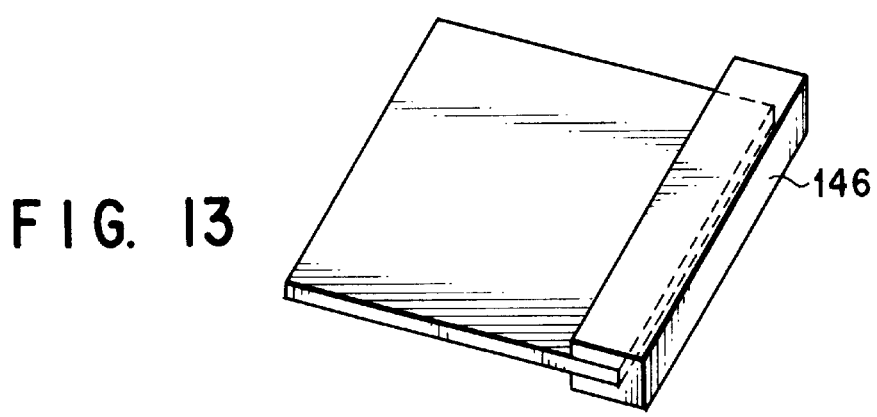
FIG. 13 is a perspective view of the substrate and the nozzle assembly shown in FIG. 12.

In the example shown in FIG. 12, two nozzles 145 and 146 are arranged so as to oppose to the opposite sides of the substrate, respectively. However, a single nozzle may be used. In this case, the single nozzle is arranged on one side of the substrate and when each of the four sides of the substrate is cleaned, the substrate is rotated at 90 degree. In other words, the four sides of the substrate are sequentially cleaned for each 90-degree rotation of the substrate.

Figure 14:
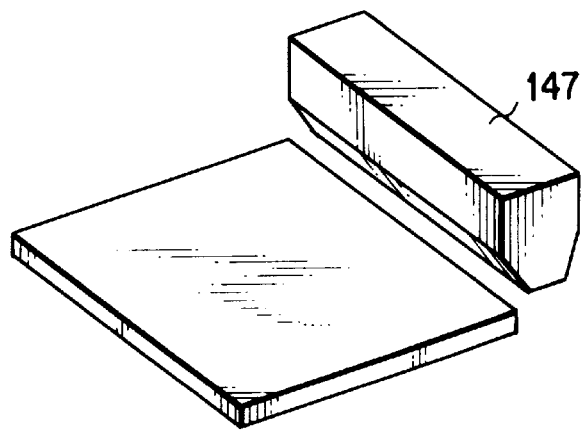
FIG. 14 is a perspective view of the substrate and the nozzle body of the nozzle assembly shown in FIG. 13

Each of the nozzles 145 and 146 has a linear nozzle body 147 for spouting solvent from a linear spray outlet as shown in FIG. 14.

Figure 15:
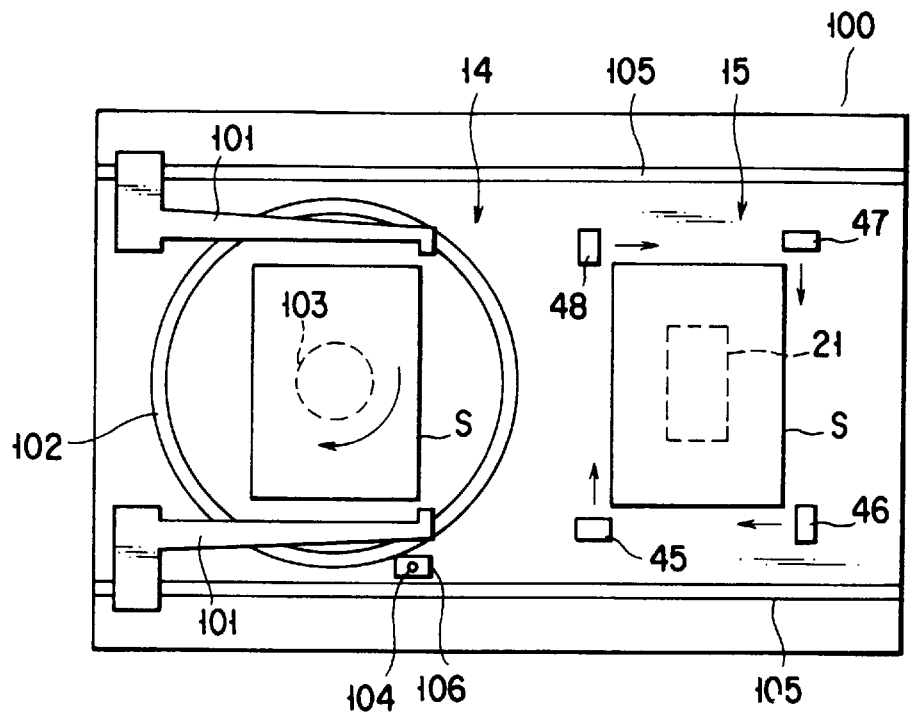
FIG. 15 is a plan view of a unit where a resist coating machine and the peripheral resist removing machine are arranged side by side.

FIG. 15 shows another embodiment. According to FIG. 15, the resist applying machine 14 and peripheral resist removing machine 15 is provided side by side in the same unit 100 and the substrate S is transported by transport arms 101 between the resist applying machine 14 and the peripheral resist removing machine 15. The resist applying machine 14 of FIG. 15 is such that a resist nozzle 104 is moved to and above the center of the substrate S sucked and held by a spin chuck 103 in a cup 102 and the rotation of the substrate S causes resist to be applied to the entire surface of the substrate by centrifugal force. The substrate S applied with resist at the resist applying machine 14 is picked up by the arm 101. The arm 101 is moved along a rail 105, thereby transporting the substrate to the peripheral resist removing machine 15. In the resist applying machine 14, the resist nozzle 104 is soaked in a solvent bath 106 filled with a resist solvent when it is not in use, which prevents the hardening of the resist at the tip of the resist nozzle 103. When the substrate S applied with resist at the resist applying machine 14 and conveyed by the arm 101 is placed on the substrate table 21 and the nozzles 45, 46, 47, and 48 are moved along the corresponding four sides of the substrate S, this allows the peripheral resist removing machine 15 to dissolve and remove the unnecessary resist stuck to the periphery of the substrate S.

By arranging the resist applying machine 14 and peripheral resist removing machine 15 side by side and causing the arm 101 to convey the substrate S between them, the transporting operation of the main arm 4 is simplified and the throughput is improved.

Figures 16, 17:
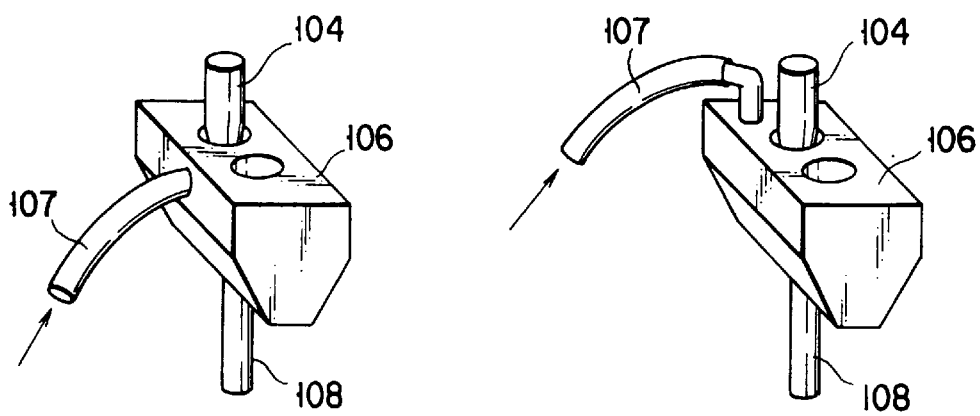
FIG. 16 is a perspective view of an improved solvent bath.
FIG. 17 is a perspective view of a prior solvent bath.

A widely-used supply line 107 supplying a solvent to the solvent bath 106 has been connected to the side of the solvent bath 106 as shown in FIG. 16. This causes the fear that the solvent supplied to the solvent bath 106 will not flow smoothly to the drain 108 and will flow backward to the supply Line 107.

To avoid the fear, it is favorable that the supply line 107 for supplying the solvent to the solvent bath 106 is connected to the top side of the solvent bath 106. This will prevent the solvent from flowing backward to the supply line 107.

When the resist applying machine 14 and peripheral resist removing machine 15 are provided in the same unit 100 as described above, the bringing and carrying of the substrate S into and out of the unit 100 is effected in such manner that the substrate S temperature-adjusted at the cooling machine 12 is picked up by the main arm 4, while being removed of the unnecessary resist on the periphery and that the resulting substrate S is temperature-adjusted and is brought into the resist applying machine 14. It is apparent that such an operation will cause a temperature difference between the first substrate S and the second or later substrate S, which will probably have an adverse effect on the average film thickness (Ave). To avoid such an adverse effect, firstly it is desirable that three substrates S should be provided in the unit 100. Depending on the situation, the width of the unit 100 may be made greater slightly. Secondly, it is favorable that the substrate S received from the cooling machine 12 is transported immediately to the resist applying machine 14 and thereafter the substrate S from the peripheral resist removing machine 15 is received.

With the present resist applying machine 14, when the system power is turned off, the chamber of the resist applying machine 14 goes down earlier than the spin chuck 103, permitting the chamber to press the spin chuck 103 downward. If this state continues, it may be that damage will be done to the surface of the spin chuck 103 or mist will stick to the surface of the spin chuck 103. To avoid the possible problem, it is desirable that the spin chuck 103 should be forced to go down earlier, when the power of the resist applying machine 14 is turned off.

With the present invention, the solvent vapor can be prevented from leaking out into the atmosphere around the substrate by causing the exhaust machine below the substrate to discharge downward the solvent vapor used in dissolving and removing the processing agent. In the case where the fan filter unit 110 and related parts are located above the substrate S as shown in FIG. 2, a down flow can be made around the substrate by causing the fan filter unit 110 to supply air and the exhaust machine to discharge the air simultaneously, making it possible to discharge the solvent vapor downward efficiently.

It is desirable that one or more diffusion plates should be inserted between the substrate on the substrate table and the exhaust machine to provide a uniform discharge under the entire bottom side of the substrate. The solvent for the processing agent may be supplied from a nozzle to the back of the substrate edge portion to remove the processing agent stuck to the back of the substrate simultaneously.

Furthermore, the applying machine for applying the processing agent to the surface of the substrate may be arranged next to the substrate table and a transport machine for conveying the substrate between the applying machine and the substrate table may be provided. Giving a substrate to each of the applying machine, substrate table, and transport machine thus constructed enables three substrates to be held in the processing apparatus simultaneously, which makes it possible to perform the processes of applying the processing agent and removing the processing agent from the edge of the substrate consecutively, helping shorten the processing time. This eliminates a temperature difference between a processed substrate and a subsequently processed substrate or substrates, making the processes uniform.

Additional advantages and modifications will readily occurs to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

We claim:

1. A processing apparatus comprising:
a substrate table on which a substrate having a surface having a proccessing agent thereon and a periphery is placed;
a nozzle mechanism arranged on a periphery of the substrate table for supplying a solvent to the periphery of the substrate to dissolve at least the processing agent stuck to the periphery of the substrate thereby;
suck means arranged on the periphery of the substrate table for sucking and removing the processing agent dissolved by the solvent; and
exhaust means separately located below the substrate on said substrate table for exhausting gas below the substrate, further comprising at least one diffusion plate which is provided between the substrate and said exhaust means and uniformly sucks vapor from around said substrate table.

2. A processing apparatus according to claim 1, further comprising coating means which is provided adjacent to said substrate table and coats the processing agent on the surface of the substrate, and transport means for transporting the substrate between said applying means and said substrate table.

3. A processing apparatus according to claim 1, wherein said nozzle mechanism has a nozzle for supplying the solvent to front and back sides of the periphery of the substrate.

4. A processing apparatus according to claim 3, further comprising coating means that is provided adjacent to said substrate table and coats the processing agent on the surface of the substrate, and transport means for transporting the substrate between said coating means and said substrate table.

5. A processing apparatus comprising:
a coating machine for coating a processing film on a surface of a substrate;
a processing agent removing machine; and
a transport machine for transporting the substrate from said coating machine to said processing agent removing machine, wherein
said processing agent removing machine comprises,
a substrate table on which the substrate brought in by said transport machine is placed;
solvent blow-off means for spraying a solvent on the periphery of the substrate to dissolve and remove a processing agent stuck to the periphery of the substrate on said substrate table;
discharge means for discharging the solvent used to dissolve and remove the processing agent and the dissolved and removed processing agent; and
exhaust means for exhausting gas under said substrate table downward,
wherein said substrate table has a plurality of suck members provided on a top surface of the substrate table for sucking and holding the substrate.

6. A processing apparatus comprising:
a coating machine for coating a processing film on a surface of a substrate;
a processing agent removing machine; and
a transport machine for transporting the substrate from said coating machine to said processing agent removing machine, wherein
said processing agent removing machine comprises,
a substrate table on which the substrate brought in by said transport machine is placed;
solvent blow-off means for spraying a solvent on the periphery of the substrate to dissolve and remove a processing agent stuck to the periphery of the substrate on said substrate table;
discharge means for discharging the solvent used to dissolve and remove the processing agent and the dissolved and removed processing agent; and
exhaust means for exhausting gas under said substrate table downward,
further including diffusion means provided between said substrate table and said exhaust means for diffusing gas below the substrate.

7. A processing apparatus according to claim 6, wherein said diffusion means comprises a plurality of diffusion plates arranged one on top of another, said diffusion plates including a first diffusion plate in which a large number of vents are made and a second diffusion plate that is provided above the first diffusion plate and has a large number of vents greater in size and in the distance between vents than the vents in the first diffusion plate.

8. A processing apparatus according to claim 7, wherein at least said second diffusion plate has an area having no vent on at least one location adjacent to an exhaust pipe.

* * * * *

UNITED STATES PATENT AND TRADEMARK OFFICE
CERTIFICATE OF CORRECTION

PATENT NO. : 5,993,552
DATED : November 30, 1999
INVENTOR(S) : Takeshi TSUKAMOTO et al.

It is certified that error appears in the above-indentified patent and that said Letters Patent is hereby corrected as shown below:

On the title page, item [73], the Assignee has been omitted. It should be:

--[73] Assignee: Tokyo Electron Limited
Tokyo, Japan--

Signed and Sealed this

Tenth Day of April, 2001

Attest:

NICHOLAS P. GODICI

Attesting Officer

Acting Director of the United States Patent and Trademark Office